(12) United States Patent
Nie et al.

(10) Patent No.: US 7,924,566 B2
(45) Date of Patent: Apr. 12, 2011

(54) HEAT DISSIPATION DEVICE

(75) Inventors: Wei-Cheng Nie, Shenzhen (CN); Hong-Cheng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 173 days.

(21) Appl. No.: 12/436,098

(22) Filed: May 5, 2009

(65) Prior Publication Data

US 2010/0220447 A1   Sep. 2, 2010

(30) Foreign Application Priority Data

Mar. 2, 2009   (CN) .......................... 2009 1 0300635

(51) Int. Cl.
*H05K 7/20* (2006.01)
(52) U.S. Cl. ... 361/710; 361/709; 361/719; 361/679.54; 165/80.2
(58) Field of Classification Search .................. 361/719, 361/709, 710, 679.54; 257/727; 165/80.2
See application file for complete search history.

(56) References Cited

U.S. PATENT DOCUMENTS

| | | | | |
|---|---|---|---|---|
| 6,304,452 B1 * | 10/2001 | Lo | ................................. | 361/704 |
| 6,307,748 B1 * | 10/2001 | Lin et al. | ........................ | 361/704 |
| 6,331,937 B1 * | 12/2001 | Bartyzel | ................. | 361/679.54 |
| 6,475,030 B1 * | 11/2002 | Chang | ............................ | 439/557 |
| 6,545,879 B1 * | 4/2003 | Goodwin | ....................... | 361/807 |
| 6,557,675 B2 * | 5/2003 | Iannuzzelli | ................... | 188/380 |
| 6,679,712 B2 * | 1/2004 | Chang | ............................ | 439/248 |
| 6,697,256 B1 * | 2/2004 | Horng et al. | ................... | 361/704 |
| 6,786,691 B2 * | 9/2004 | Alden, III | ................... | 411/371.2 |
| 6,826,054 B2 * | 11/2004 | Liu | ................................. | 361/719 |
| 6,930,884 B2 * | 8/2005 | Cromwell et al. | ............. | 361/710 |
| 7,042,727 B2 * | 5/2006 | Ulen et al. | ....................... | 361/704 |
| 7,116,556 B2 * | 10/2006 | Lee et al. | ........................ | 361/704 |
| 7,126,823 B2 * | 10/2006 | Chen et al. | ..................... | 361/702 |
| 7,161,808 B2 * | 1/2007 | Atkinson | ....................... | 361/719 |
| 7,167,370 B2 * | 1/2007 | Lee et al. | ........................ | 361/719 |
| 7,180,743 B2 * | 2/2007 | Chen et al. | ..................... | 361/704 |
| 7,209,354 B2 * | 4/2007 | Wu et al. | ......................... | 361/697 |
| 7,342,796 B2 * | 3/2008 | Aukzemas | ...................... | 361/719 |
| 7,359,200 B2 * | 4/2008 | Zhou et al. | ..................... | 361/704 |
| 7,430,122 B2 * | 9/2008 | Li | .................................. | 361/719 |
| 7,474,530 B2 * | 1/2009 | Stewart et al. | ................. | 361/704 |
| 7,474,532 B1 * | 1/2009 | Desrosiers et al. | ............ | 361/719 |
| 7,576,989 B2 * | 8/2009 | Li et al. | .......................... | 361/719 |
| 2004/0105236 A1 * | 6/2004 | Lee et al. | ........................ | 361/704 |
| 2004/0253077 A1 * | 12/2004 | Aoki et al. | ..................... | 411/508 |
| 2006/0007659 A1 * | 1/2006 | Lee et al. | ........................ | 361/704 |
| 2006/0275100 A1 * | 12/2006 | Aukzemas | ..................... | 411/353 |
| 2007/0217159 A1 * | 9/2007 | Long et al. | ..................... | 361/704 |

* cited by examiner

*Primary Examiner* — Anatoly Vortman
(74) *Attorney, Agent, or Firm* — Frank R. Niranjan

(57) ABSTRACT

A heat dissipation device includes a heat sink in which a plurality of mounting holes are defined, and a plurality of fasteners. Each of the fasteners includes a shaft with one end thereof received in a corresponding mounting hole, a sleeve enclosing the shaft and received in the mounting hole, and a fixture engaging the shaft and pressing the heat sink and a bottom end of the sleeve. The sleeve is filled between the end of the shaft and an inner face of the heat sink defining the mounting hole to perform an engagement of the shaft in the mounting hole of the heat sink, thereby fastening the fasteners to the heat sink. The shaft has a screw extending out of the mounting hole for mounting the heat sink on a printed circuit board.

15 Claims, 4 Drawing Sheets

HEAT DISSIPATION DEVICE

BACKGROUND

1. Technical Field

The disclosure relates to heat dissipation devices and, more particularly, to a heat dissipation device with a novel securing structure.

2. Description of Related Art

With development in computer technology, electronic devices operate at high speeds, at which considerable heat is generated. If the heat is not dissipated, the stability of the operation of the electronic devices will be impacted severely. Generally, a heat sink is deployed to dissipate the heat generated by the electronic device. In order to make the heat sink contact the electronic device intimately, a fastening structure is used to secure the heat sink to a printed circuit board on which the electronic device is mounted.

Generally, the heat sink comprises a conductive plate thermally contacting the electronic device and a plurality of fins formed on the conductive plate. The conductive plate of the heat sink defines a plurality of mounting holes in a bottom thereof. A plurality of pins are fastened on the conductive plate of the heat sink to secure the heat sink on a printed circuit board, wherein first ends of the pins are pressed into the mounting holes of the conductive plate, second ends of the pins extend through the printed circuit board and engage with a back plate beneath the printed circuit board. However, it is difficult to precisely define said mounting holes in the bottom of the conductive plate. Furthermore, if a center of the pin is not in alignment with that of the mounting hole, the pin will be prone to disengage from the conductive plate during the process of pressing the pins, and the heat sink will not be firmly secured to the printed circuit board.

What is needed, therefore, is a heat dissipation device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
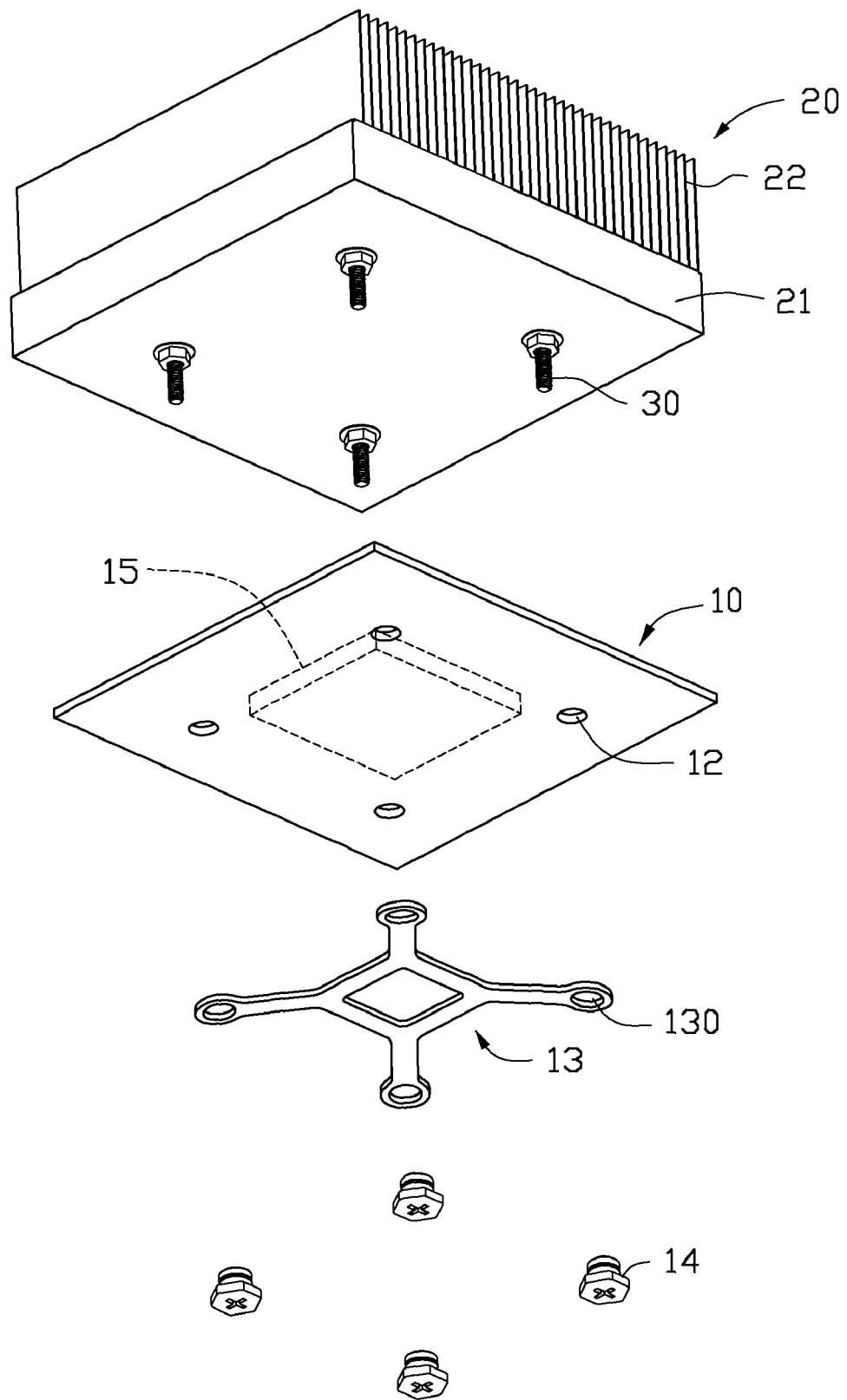
FIG. 1 is an isometric, assembled view of a heat dissipation device in accordance with an embodiment of the disclosure, with a printed circuit board located below the heat dissipation device and a back plate located below the printed circuit board.

FIG. 1 shows a heat dissipation device in accordance with an embodiment of the disclosure. The heat dissipation device, mounted on a printed circuit board 10, dissipates heat generated by an electronic device 15 also mounted on the printed circuit board 10.

The heat dissipation device includes a heat sink 20 and four fasteners 30 fastened to the heat sink 20. The printed circuit board 10 defines four first mounting holes 12.

Figure 2:
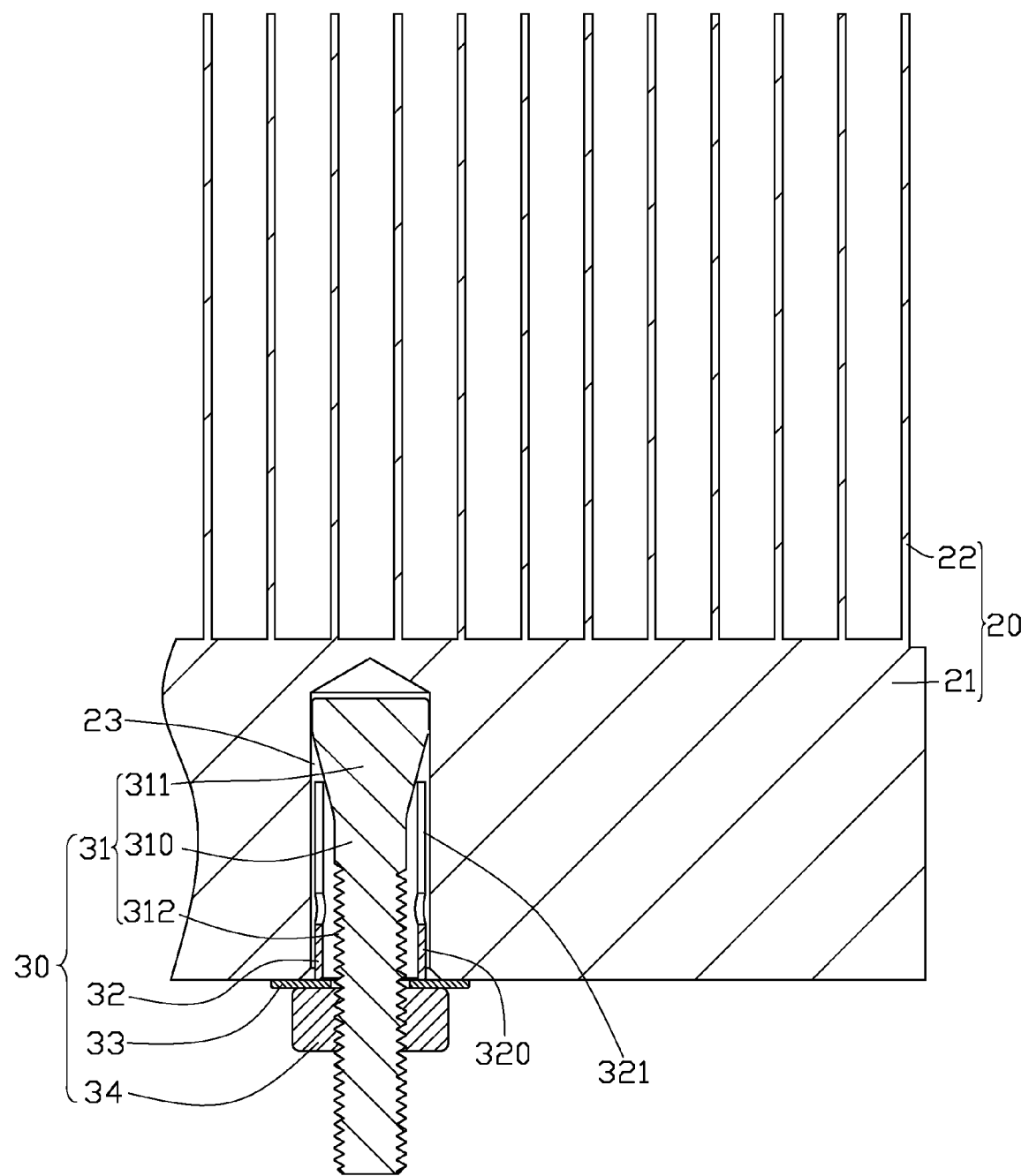
FIG. 2 is a cross-section view of the heat dissipation device of FIG. 1, with a fastener thereof in a released position.

Also referring to FIG. 2, the heat sink 20 is metal such as aluminum, copper or an alloy thereof. The heat sink 20 comprises a conductive plate 21 and a plurality of fins 22 integrally extending from a top face of the conductive plate 21. A bottom face of the conductive plate 21 intimately contacts a top face of the electronic device 15 for absorbing heat therefrom. The conductive plate 21 defines four second mounting holes 23 in the bottom face near four corners thereof, corresponding to the first mounting holes 12 in the printed circuit board 10.

Figure 4:
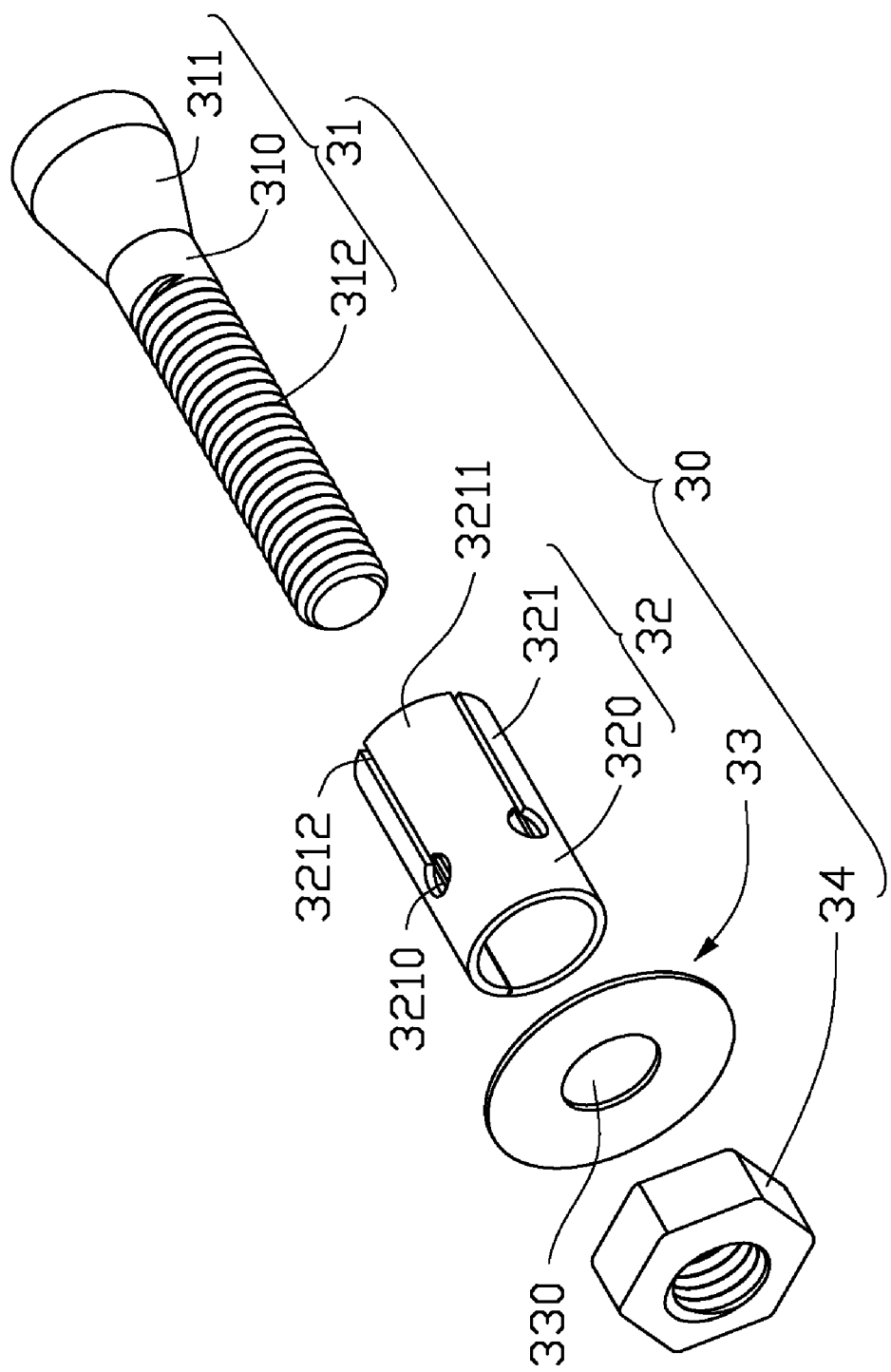
FIG. 4 is an exploded view of a fastener of FIG. 1.

Also referring to FIG. 4, each of the fasteners 30 comprises a shaft 31, a sleeve 32 enclosing the shaft 31, a baffle plate 33 and a fixture 34 both surrounding the shaft 31 under the sleeve 32. In this embodiment, the fixture 34 is a nut. The baffle plate 33 is located between a bottom end of the sleeve 32 and the fixture 34.

The shaft 31 comprises a post 310 and a head 311. The head 311 and the post 310 are coaxial with each other. A plurality of threads 312 is formed on a circumference of an outer surface of a lower portion of the post 310. In other words, a screw extends from a lower portion of the post 310. The head 311 extends upwardly from a top end of the post 310 with a diameter thereof gradually increasing along a bottom-to-up direction for a predetermined distance. The maximum diameter of the head 311 is smaller than a diameter of the second mounting hole 23, so that the whole head 311 of the shaft 31 can be inserted into the second mounting hole 23.

The sleeve 32 is column-shaped and is made from a material with a high strength. The sleeve 32 has an inner diameter slightly larger than a diameter of the post 310 of the shaft 31 and an outer diameter slightly smaller than the diameter of the second mounting hole 23. The sleeve 32 comprises a smooth portion 320 enclosing the post 310 and a blocking portion 321 engaging with the head 311 of the shaft 31. The blocking portion 321 defines a plurality of through holes 3210 and slots 3212 in communication with the through holes 3210, thereby dividing the blocking portion 321 into a plurality of spaced strips 3211. When moving the shaft 31 downwardly towards the sleeve 32, the head 311 of the shaft 31 pushes the blocking portion 321, making the strips 3211 of the blocking portion 321 expand outwardly thereby tightly engaging an inner face of the conductive plate 21 defining the second mounting hole 23.

The baffle plate 33 is an annular, metal plate. A through hole 330 in a center of the baffle plate 33 has a diameter substantially equal to that of the lower portion of the post 310 of the shaft 31 defining the threads 312, such that the baffle plate 33 fitly surrounds lower portion of the post 310 of the shaft 31 defining the threads 312.

Figure 3:
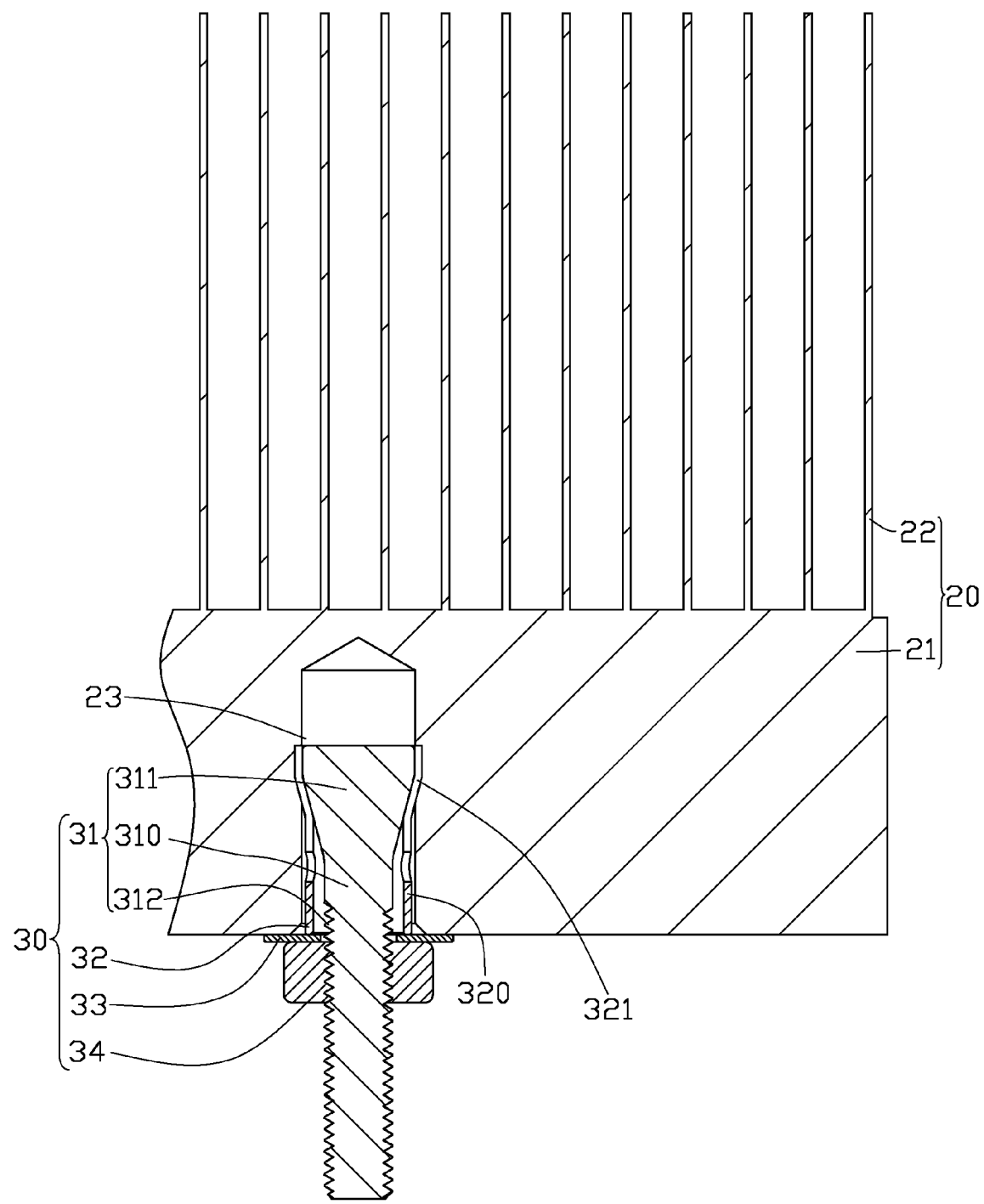
FIG. 3 is a view similar to FIG. 2, wherein the fastener is moved to a locked position.

Also referring to FIGS. 2-3, in assembly, the post 310 of the shaft 31 is inserted in the sleeve 32. The assembly of the shaft 31 and the sleeve 32 is inserted in the second mounting hole 23 in which the head 311 of the shaft 31 can move freely. The baffle plate 33 is disposed around the post 310 of the shaft 31, and the fixture 34 is screwed onto the threads 312 of the shaft 31, whereby a bottom of the baffle plate 33 is pressed by the fixture 34, a top of the baffle plate 33 presses the conductive plate 21 and a bottom end of the smooth portion 320 of the sleeve 32. The fixture 34 is driven to rotate around the shaft 31 and bring the head 311 of the shaft 31 to move downwardly toward an outside of the second mounting hole 23. Due to tapered configuration of the head 311, the blocking portion 321 is expanded by the head 311 of the shaft 31 and urged to deform outwardly, and the strips 3211 of the blocking portion 321 are filled between the head 311 and the inner face of the conductive plate 21 surrounding the second mounting hole 23. Due to the force exerted by the head 311 of the shaft 31 on the blocking portion 321, the shaft 31 is tightly secured in the second mounting hole 23. The heat sink 20 with the secured fasteners 30 is placed on a top face of the electronic device 15 on the printed circuit board 10, and the shafts 31 of the fasteners 30 extend through the four first mounting holes 12 in the printed circuit board 10 and four through holes 130 in a back plate 13 below the printed circuit board 10 in sequence. The threads 312 of the shafts 31 engage with four screw caps 14, whereby the heat sink 20 is secured onto the printed circuit board 10 and has a secure engagement with the electronic device 15.

According to the disclosure, due to the tight engagement of the head 311 of the shaft 31, the blocking portion 321 of the sleeve 32 and the inner face the conductive plate 21 defining the second mounting hole 23, and the tight engagement between baffle plate 33, the bottom end of the sleeve 32, the bottom face of the conductive plate 21, the lower portion of the shaft 31 defining the threads 312 and the fixture 34, the fastener 30 can be firmly mounted on the heat sink 20, thereby enhancing stability of the heat dissipation device mounted on the printed circuit board 10.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a heat sink comprising a conductive plate in which a plurality of mounting holes are defined; and
   a plurality of fasteners disposed in the conductive plate, each of the fasteners comprising:
      a shaft with one end thereof received in a corresponding mounting hole of the conductive plate of the heat sink;
      a sleeve enclosing the shaft and received in the corresponding mounting hole; and
      a fixture engaging the shaft and pressing the conductive plate;
   wherein the sleeve is filled between the end of the shaft and an inner face of the conductive plate surrounding the mounting hole to perform an engagement of the shaft and the mounting hole of the heat sink, thereby fastening the fasteners to the heat sink.

2. The heat dissipation device as claimed in claim 1, wherein the shaft comprises a post, a screw and a head, the head extending from a first end of the post, the screw extending from a second end of the post opposite the first end, the head having a diameter gradually increasing from the first end of the post along a direction away from the post.

3. The heat dissipation device as claimed in claim 2, wherein the sleeve comprises a smooth portion enclosing the post and a blocking portion engaging with the head.

4. The heat dissipation device as claimed in claim 3, wherein the blocking portion comprises a plurality of strips, the strips being filled between the head of the shaft and the inner face of the conductive plate surrounding the mounting hole, the strips having first ends connecting with the smooth portion, and second ends spacing from each other.

5. The heat dissipation device as claimed in claim 4, wherein the fixture is a nut threadedly engaging the screw of the shaft and pressing the conductive plate.

6. The heat dissipation device as claimed in claim 2, wherein the head and the post are coaxial with each other.

7. The heat dissipation device as claimed in claim 1, wherein the fastener further comprises a baffle plate surrounding the shaft and sandwiched between the conductive plate and the fixture.

8. The heat dissipation device as claimed in claim 7, wherein the baffle plate is an annular plate defining a through hole in a center thereof, the through hole having a diameter equal to that of the shaft.

9. A heat dissipation device for cooling an electronic device mounted on a printed circuit board, comprising:
   a heat sink comprising a conductive plate thermally contacting the electronic device and defining a plurality of mounting holes in a bottom surface thereof and a plurality of fins in thermal connection with the conductive plate; and
   a plurality of fasteners disposed in the conductive plate and extending through the printed circuit board and engaging a back plate below the printed circuit board to mount the heat sink on the electronic device, each of the fasteners comprising:
      a shaft with a first end thereof received in a corresponding mounting hole, and a second end thereof extending through the printed circuit board and engaging with the back plate;
      a sleeve enclosing the first end of the shaft and received in the mounting hole; and
      a fixture engaging the second end of the shaft to press the conductive plate and located above the printed circuit board;
   wherein the shaft is movable in the mounting hole to reach a locking position in which the first end of the shaft expands the sleeve to make the sleeve abutting against an inner face of the conductive plate surrounding the mounting hole, whereby the fastener is secured in the mounting hole of the heat sink.

10. The heat dissipation device as claimed in claim 9, wherein the shaft comprises a post and a head extending from a first end of the post and a screw extending from a second end of the post opposite the first end, the head having a diameter gradually increasing from the first end of the post to another end away from the post, the diameter of the head being larger than an inner diameter of the sleeve, the second end of the shaft being a part of the screw.

11. The heat dissipation device as claimed in claim 10, wherein the sleeve comprises a smooth portion enclosing the post and a blocking portion engaging with the head of the shaft.

12. The heat dissipation device as claimed in claim 11, wherein the blocking portion comprises a plurality of strips, the strips abutting against the head of the shaft and the inner face of the conductive plate of the heat sink defining the mounting hole, the strips having first ends connecting with the smooth portion, and second ends spacing from each other.

13. The heat dissipation device as claimed in claim 11, wherein the fixture is a nut threadedly engaging the screw of the shaft and pressing a bottom end of the smooth portion of the sleeve.

14. The heat dissipation device as claimed in claim 10, wherein the fastener further comprises a baffle plate surrounding the shaft and sandwiched between the conductive plate and the fixture.

15. The heat dissipation device as claimed in claim 14, wherein the baffle plate is an annular plate defining a through hole in a center thereof, the through hole having a diameter equal to that of the shaft.

* * * * *